US008878569B1

(12) United States Patent
Fullerton

(10) Patent No.: US 8,878,569 B1
(45) Date of Patent: Nov. 4, 2014

(54) SELF-RECOVERING BUS SIGNAL DETECTOR

(71) Applicant: Atmel Corporation, San Jose, CA (US)

(72) Inventor: Ian Fullerton, Tanem (NO)

(73) Assignee: Atmel Corporation, San Jose, CA (US)

( * ) Notice: Subject to any disclaimer, the term of this patent is extended or adjusted under 35 U.S.C. 154(b) by 7 days.

(21) Appl. No.: 13/868,930

(22) Filed: Apr. 23, 2013

(51) Int. Cl.
*H03K 19/00* (2006.01)
(52) U.S. Cl.
CPC .................................. *H03K 19/0021* (2013.01)
USPC ................... 326/94; 326/21; 326/28; 326/86
(58) Field of Classification Search
None
See application file for complete search history.

(56) References Cited

U.S. PATENT DOCUMENTS

| 5,596,288 | A | * | 1/1997 | Simmons et al. | 327/12 |
| 5,925,135 | A | * | 7/1999 | Trieu et al. | 713/400 |
| 2009/0102507 | A1 | * | 4/2009 | Grise et al. | 326/16 |

* cited by examiner

*Primary Examiner* — Anh Tran
(74) *Attorney, Agent, or Firm* — Fish & Richardson P.C.

(57) ABSTRACT

A detector circuit is disclosed that detects bus signal conditions. To detect a START condition, asynchronous sequential logic detects a first bus signal transition (e.g., from high to low) and a second bus signal (e.g., a high signal). The outputs of the asynchronous sequential logic are combined to produce a START signal that can be latched, so that the START signal can be used to wake up a system or for other purposes. To detect a STOP condition, asynchronous sequential logic is set by a transition (e.g., low to high) of the first bus signal and a second bus signal (e.g., a high signal), producing a STOP signal that can be used to reset the asynchronous sequential logic and the latch.

13 Claims, 5 Drawing Sheets

SELF-RECOVERING BUS SIGNAL DETECTOR

TECHNICAL FIELD

This disclosure relates generally to bus signal decoding.

BACKGROUND

Inter-Integrated Circuit ($I^2C$) is a multi-master, serial, single-ended computer bus used for attaching low-speed peripherals to a motherboard, embedded system, mobile device or other electronic device. $I^2C$ uses two bidirectional open-drain lines, Serial Data Line (SDA) and Serial Clock (SCL), pulled up with resistors. Nodes on the bus can have a master or slave role. $I^2C$ defines three basic types of messages, each of which begins with START and ends with STOP. These messages include: 1) single message where a master writes data to a slave; 2) single message where a master reads data from a slave; and 3) combined messages, where a master issues at least two reads and/or writes to one or more slaves.

FIG. 1 is a timing diagram illustrating START/STOP conditions for an $I^2C$ bus. A START condition S is denoted by a high to low transition on SDA while SCL is high, and the STOP condition P is denoted by a low to high transition on SDA while SCL is high.

A slave device or a master device in a multi-master system coupled to an $I^2C$ bus requires a START/STOP detector to detect the START/STOP conditions on SDA and SCL. One commonly used method is to synchronize SDA and SCL to a system clock, and use synchronous logic for START and STOP detection. The drawback of this method is that it requires a running system clock that is faster than the SCL frequency.

SUMMARY

A detector circuit is disclosed that detects bus signal conditions (e.g., $I^2C$ bus signals). To detect a START condition, asynchronous sequential logic detects a first bus signal transition (e.g., from high to low) and a second bus signal (e.g., a high signal). The outputs of the asynchronous sequential logic are combined to produce a message START signal that can be latched, so that the message START signal can be used to wake up a system or for other purposes.

To detect a STOP condition, asynchronous sequential logic detects a first bus signal transition (e.g., low to high) and a second bus signal (e.g., a high signal), producing a STOP signal that can be used to reset the asynchronous sequential logic and the latch. Delay elements and combinational logic are used with the asynchronous sequential logic devices to apply Boolean logic to signals and handle potential illegal conditions.

In some implementations, a circuit for detecting bus signals on a bus includes first asynchronous sequential logic (e.g., a flip-flop) having a first input for receiving a first bus signal (e.g., $I^2C$ SDA) and a second input. The circuit further includes first combinational logic (e.g., XOR gate) having a first input for receiving an output of the first asynchronous sequential logic and a second input for receiving a second bus signal (e.g., $I^2C$ SCL), an output of the first combinational logic coupled to the second input of the first asynchronous sequential logic. The circuit further includes second asynchronous sequential logic (e.g., a flip-flop) having a first input for receiving the second bus signal and a second input for receiving the output of the first asynchronous sequential logic. The circuit further includes second combinational logic (e.g., XOR gate) having a first input for receiving the output of the first asynchronous sequential logic device and a second input for receiving the output of the second asynchronous sequential logic device, an output of the second combinational logic providing a START signal.

Particular implementations of the self-recovering bus signal detector disclosed herein provide one or more of the following advantages: 1) bus signal conditions are detected without a running system clock; 2) no requirement for a bus clock to system clock ratio; and 3) noise immunity.

DETAILED DESCRIPTION

Figure 1:
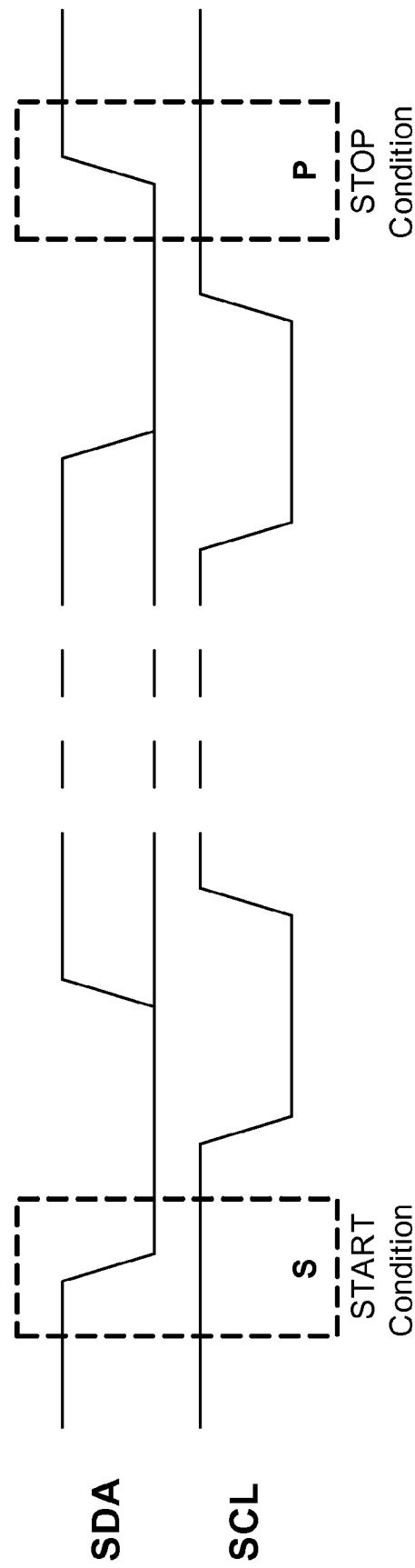
FIG. 1 is a timing diagram illustrating START/STOP conditions for an $I^2C$ bus.
Figure 2:
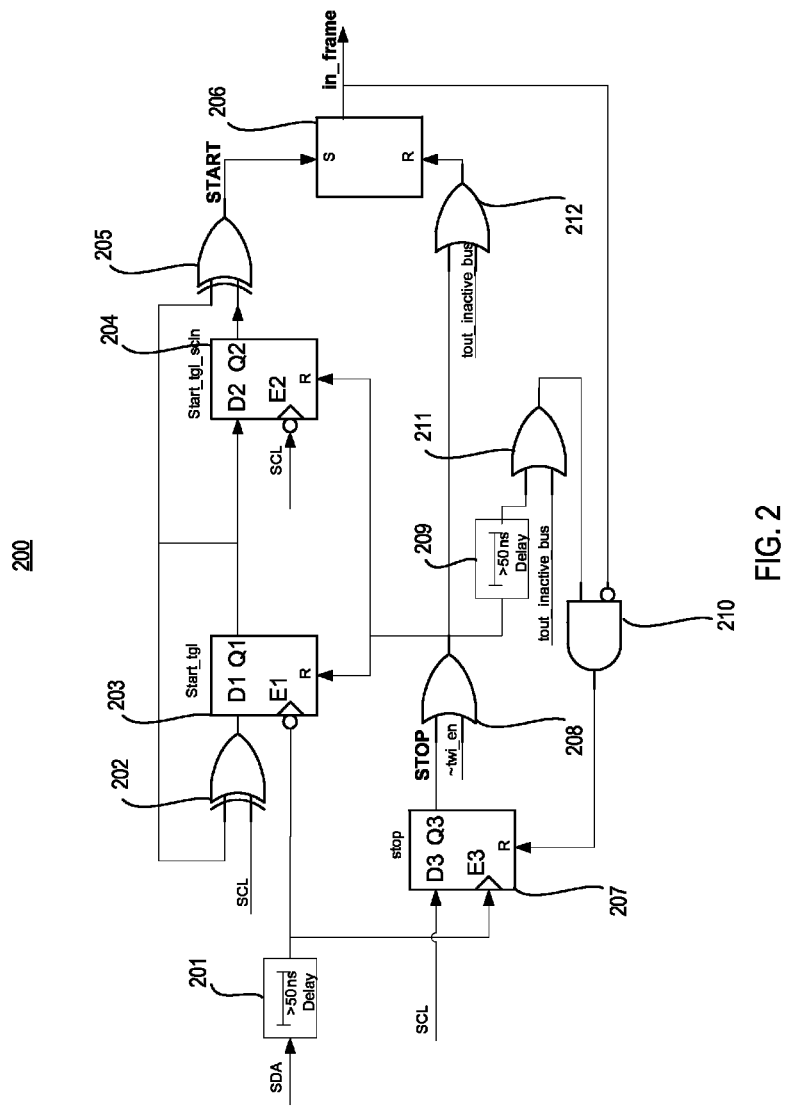
FIG. 2 is a schematic diagram of an example START/STOP detector circuit.

FIG. 2 is a schematic diagram of an example START/STOP detector circuit 200. In some implementations, detector circuit 200 can include sequential logic devices 203, 204, 207, combinational logic devices 202, 205, 208, 211, 212, 210, delay elements 201, 209 and latch 206.

All of the sequential logic devices 203, 204, 207 in circuit 200 are configured to operate asynchronously (without a system clock). A sequential logic device is a digital circuit whose output depends not only on the present value of its input signals but also on the past history of its inputs. This is in contrast to combinational logic devices, whose output is a function of only the present input. That is, sequential logic devices have state (memory) while combinational logic devices do not. Digital sequential logic devices are divided into synchronous and asynchronous types. In synchronous sequential devices, the state of the device changes only at discrete times in response to a clock signal. In asynchronous sequential logic devices, the state of the device can change at any time in response to changing inputs. Because it is desired to construct a detector that does not rely on a system clock, the sequential logic devices used in the example detector 200 are asynchronous type sequential logic devices.

The devices 202, 203, 204 and 205 are used to detect START conditions. Delay element 201 (e.g., an inverter chain or an RC time delay circuit) receives SDA and has an output coupled to the enable inputs of sequential logic devices 203, 207. In some implementations, delay element 201 can provide a delay that is greater than 50 nanoseconds. Delay element 201 allows time for SCL to stabilize through circuit 200 before enabling devices 203, 207, as shown in FIG. 2.

Device 203 has a data input D1 and inverted enable input E1. Each time a transitioning SDA signal (e.g. high to low) is applied to the inverted enable input E1, the signal propagates from D1 to Q1. In this example, the output of XOR gate 202 is coupled to input D1 and propagates to output Q1 when SDA transitions from high to low. XOR gate 202 takes as inputs the bus clock SCL and the output Q1. When Q1=1, SCL=0 or when Q1=0, SCL=1 and SDA transitions from high to low, output Q1 toggles.

In some implementations, the output Q1 of device 203 is coupled to input D2 of device 204. The inverted enable input E2 of device 204 is coupled to SCL. Device 204 is included in circuit 200 for stable operation. The output Q2 of device 204 is input into XOR gate 205 together with the output Q1 of device 203. When Q1=1, Q2=0 or when Q1=0, Q2=1, a START signal is generated. The START signal can be used to set latch 206, which can be used to wake up a system or for other purposes.

The sequential logic device 207 in the lower portion of circuit 200 is used to detect STOP conditions. SCL is coupled to input D3 of device 207 and propagates to output Q3 when SDA transitions from low to high. The enable input E2 is coupled to the output of delay element 201. The inputs of OR gate 208 are output Q3 and signal ~twi_en. Note that the symbol "~" means complement. The signal twi_en can be generated by another component in the system and is used to reset devices 203, 204, 206, and 207 independent of the output Q3.

When SDA transitions from low to high while SCL is high, Q3 generates a STOP signal. The STOP signal and ~twi_en are inputs to OR gate 208. The output of OR gate 208 is coupled to the reset inputs of devices 203, 204 and latch 206 by way of OR gate 212. The inputs of OR gate 212 are the output Q3 and inactive bus signal tout_inactive_bus. If either the output Q3 or tout_inactive_bus are high, latch 206 is reset.

Circuit 200 includes delay element 209, OR gate 211 and AND gate 210 to allow device 207 to reset itself. The output of OR gate 208 is coupled to the input of delay element 209 (e.g., an inverter chain or RC time delay circuit) and signal tout_inactive_bus. In some implementations, delay element 209 can provide a delay that is greater than 50 nanoseconds. The output of OR gate 211 is coupled to an input of AND gate 210. The other input of AND gate 210 (inverted input) is coupled to the output of latch 206. When latch 206 is reset, its output is low and the output of OR gate 211 is high. The signals cause AND gate 210 to output a high signal, which resets device 207. Delay element 209 allows time for latch 206 to be reset before resetting device 207.

Figure 3:
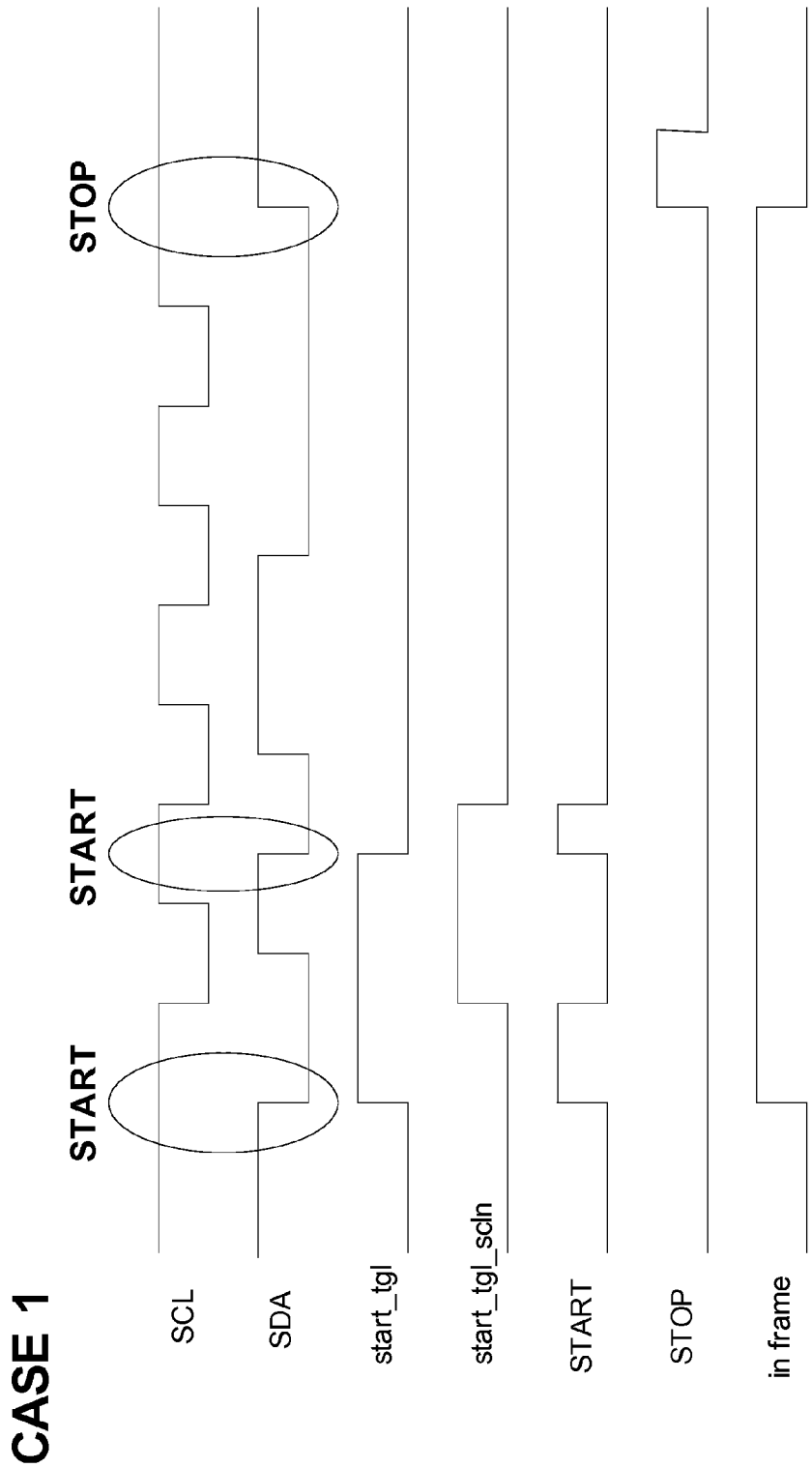
FIG. 3 is timing diagram illustrating repeated START conditions that can be handled by the detector circuit of FIG. 2.

FIG. 3 is timing diagram illustrating repeated START conditions that can be handled by the detector circuit of FIG. 2. A START is followed by a repeated START. As shown in FIG. 3, both START conditions are detected by circuit 200.

Figure 4:
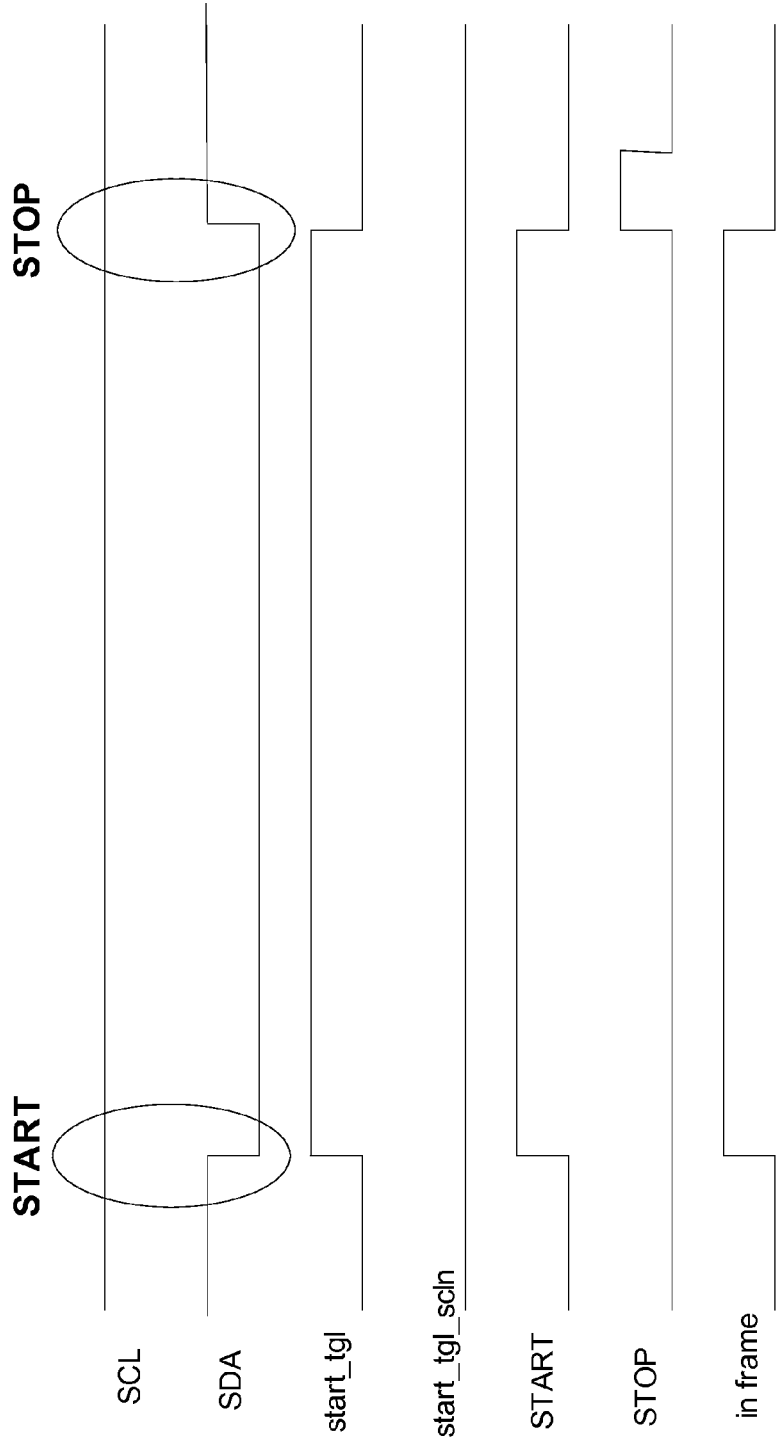
FIG. 4 is timing diagram illustrating an illegal START condition followed by a STOP condition that can be handled by the detector circuit of FIG. 2.

FIG. 4 is timing diagram illustrating an illegal START condition followed by a STOP condition that can be handled by the detector circuit of FIG. 2. FIG. 4 illustrates how circuit 200 responds when noise is present on the SDA line. If the pulse is long enough, the START will be detected, but detection is reset once SDA goes high.

Figure 5:
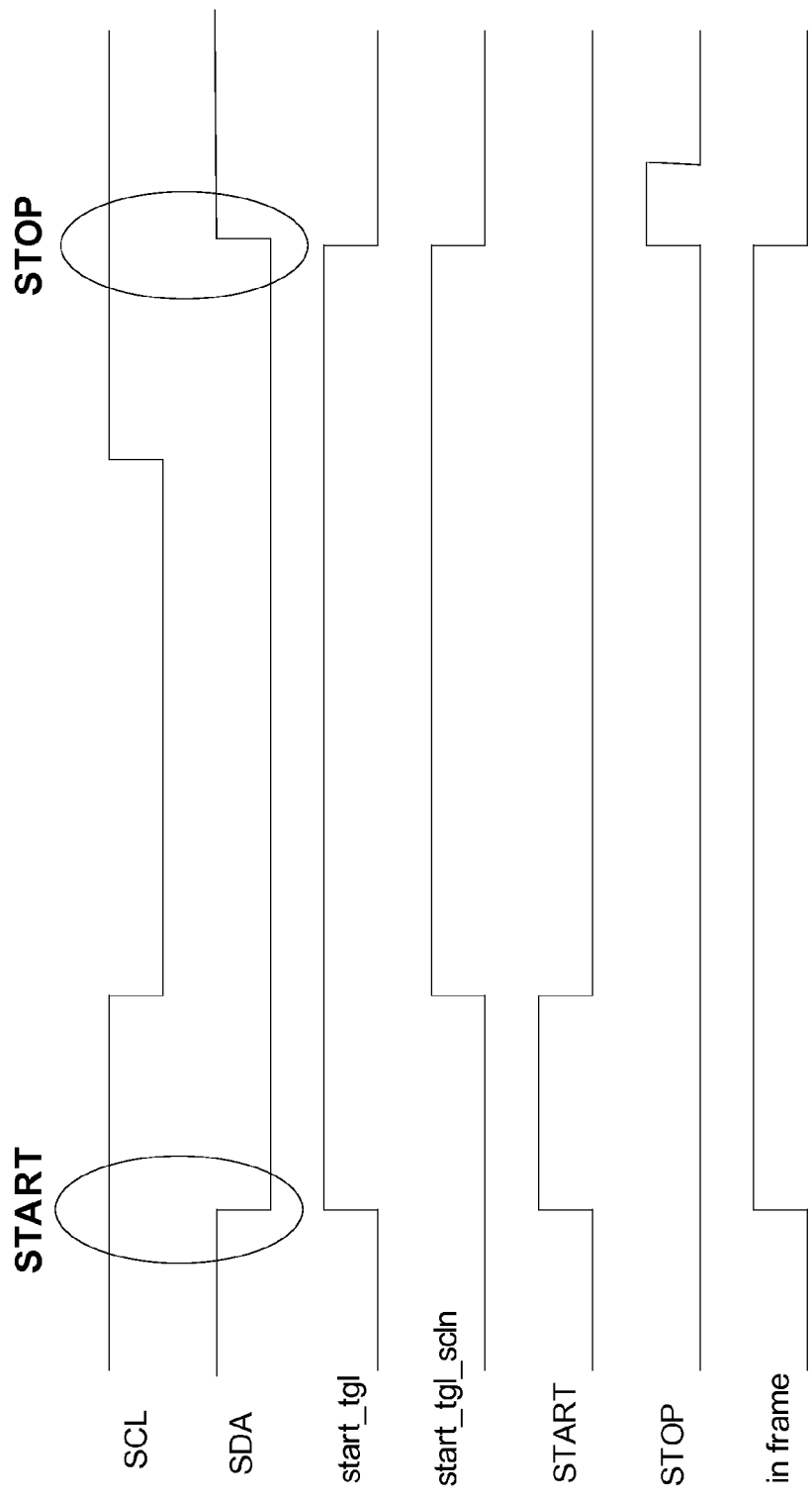
FIG. 5 is timing diagram illustrating an illegal START/STOP condition with low bus clock that can be handled by the detector circuit of FIG. 2.

FIG. 5 is timing diagram illustrating an illegal START/ STOP condition with low bus clock that can be handled by the detector circuit of FIG. 2. FIG. 5 illustrates how circuit 200 handles an illegal START/STOP when SCL also goes low.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A circuit for detecting bus signals on a bus, the circuit comprising:
    first asynchronous sequential logic having a first input for receiving a first bus signal and a second input;
    first combinational logic having a first input for receiving an output of the first asynchronous sequential logic and a second input for receiving a second bus signal, an output of the first combinational logic coupled to the second input of the first asynchronous sequential logic;
    second asynchronous sequential logic having a first input for receiving the second bus signal and a second input for receiving the output of the first asynchronous sequential logic; and
    second combinational logic having a first input for receiving the output of the first asynchronous sequential logic and a second input for receiving the output of the second asynchronous sequential logic, an output of the second combinational logic providing a start signal.

2. The circuit of claim 1, further comprising:
    a latch coupled to the output of the second combinational logic for latching the start signal.

3. The circuit of claim 1, where the first combinational logic includes an exclusive OR (XOR) gate.

4. The circuit of claim 1, where the second combinational logic includes an exclusive OR (XOR) gate.

5. The circuit of claim 1, where the first and second asynchronous sequential logic includes flip-flops.

6. The circuit of claim 2, further comprising:
    a first delay element coupled to the first bus signal and the first input of the first asynchronous sequential logic.

7. The circuit of claim 1, where the bus signals are Inter-Integrated Circuit ($I^2C$) bus signals and the first bus signal is SDA and the second bus signal is SCL.

8. The circuit of claim 6, further comprising:
    third asynchronous sequential logic having a first input for receiving the first bus signal and a second input for receiving the second bus signal, an output of the third asynchronous sequential logic providing a stop signal.

9. The circuit of claim 8, where the stop signal is coupled to reset inputs of the first, second, third asynchronous sequential logic and the latch.

10. The circuit of claim 8, where the third asynchronous sequential logic includes a flip-flop.

11. The circuit of claim 10, further comprising:
    third combinational logic having an output coupled to a reset input of the third asynchronous sequential logic, a first input coupled to the output of the latch and a second input coupled to the output of the third asynchronous sequential logic.

12. The circuit of claim 11, where the third combinational logic includes an AND gate.

13. The circuit of claim 12, further comprising:
    a second delay element coupled between the output of the third asynchronous sequential logic and the second input of the third combinational logic.

* * * * *